(12) United States Patent
Pessi

(10) Patent No.: US 7,882,263 B2
(45) Date of Patent: Feb. 1, 2011

(54) SIGNAL MESSAGE COMPRESSION

(75) Inventor: Pekka Pessi, Helsinki (FI)

(73) Assignee: Nokia Corporation, Espoo (FI)

( * ) Notice: Subject to any disclaimer, the term of this patent is extended or adjusted under 35 U.S.C. 154(b) by 1482 days.

(21) Appl. No.: 11/249,341

(22) Filed: Oct. 14, 2005

(65) Prior Publication Data

US 2007/0002780 A1      Jan. 4, 2007

(30) Foreign Application Priority Data

Jun. 30, 2005    (GB) ................................ 0513433.3

(51) Int. Cl.
*G06F 15/173* (2006.01)
*G06F 15/16* (2006.01)
(52) U.S. Cl. ...................... 709/238; 709/247
(58) Field of Classification Search ........................ None
See application file for complete search history.

(56) References Cited

U.S. PATENT DOCUMENTS

| 6,963,587 | B2 * | 11/2005 | Hannu et al. ................. 370/477 |
| 2002/0059462 | A1 | 5/2002 | Hannu et al. |
| 2002/0132613 | A1 | 9/2002 | Leung et al. |
| 2003/0120813 | A1 | 6/2003 | Majumdar et al. |
| 2003/0233478 | A1 | 12/2003 | Chuah et al. |
| 2004/0139298 | A1 * | 7/2004 | Holloway et al. ........... 712/210 |
| 2005/0270188 | A1 * | 12/2005 | Chu ............................. 341/50 |
| 2006/0291437 | A1 | 12/2006 | Naqvi et al. |
| 2007/0002855 | A1 | 1/2007 | Pessi |

FOREIGN PATENT DOCUMENTS

| EP | 1248484 A1 | 10/2002 |
| EP | 1376878 A1 | 1/2004 |
| WO | WO 0215601 A2 | 2/2002 |
| WO | WO 2005011175 A2 | 2/2005 |

OTHER PUBLICATIONS

Nordberg, Mats et al., "*Improving SigComp Performance Through Extended Operations*", Vehicular Technology Conference, 2003, Oct. 6, 2003, pp. 3425-3428.
Surtees, a. et al., "*SigComp Users' Guide*", Internet Engineering Task Force, XP015038901, Feb. 18, 2005.
Hannu et al., *Signaling Compression (SigComp)—Extended Operations*, Request for Comment 3321 (Section 5), Jan. 2003, pp. 1-19.
Deutsch, *Deflate Compressed data Format Specification Versions 1.3*, Request for Comment 1951, Aladdin Enterprises, May 1996, pp. 1-17.

(Continued)

*Primary Examiner*—John B. Walsh
(74) *Attorney, Agent, or Firm*—Alston & Bird LLP

(57) ABSTRACT

A method for compressing a signalling message in a communication system. The method comprising the steps of: receiving a part of the signalling message; detecting in a memory a copy of the part of the signalling message; comparing the length of the detected part against a stored length value; and dependent on the output of the comparison step performing a step of storing the detected part of the signalling message in the memory.

21 Claims, 4 Drawing Sheets

OTHER PUBLICATIONS

Sidebottom et al., *Signaling System 7 (SS7) Message Transfer Part 3 (MTP3)—User Adaptation Layer (M3UA)*, Request for Comment 3332, Ericsson Editors, Sep. 2002, pp. 1-120.

Ziv et al., *A Universal Algorithm for Sequential Data Compression*, IEEE Transactions on Information Theory, May 1997, vol. IT-23, No. 3., pp. 337-343.

Day et al.., *A Model for Presence and instant Messaging*, Request for Comment 2778, Feb. 2000, pp. 1-17.

Sawazaki, *Study Regarding Problems for Realizing Presence API Realication*, IEICE Technology Review, vol. 101, No. 717, Mar. 8, 2002, IN2001-237, pp. 177-183.

3rd Generation Partnership Project, Jun. 1999, 3G TS 31.102 USIM Characteristics, Available at http:www.3gpp.org/ftp/Specs/html-info/31102.htm.

International Search Report from PCT/IB2006/001850, mailed Oct. 12, 2006.

Written Opinion for PCT/IB2006/001850, mailed Oct. 12, 2006.

\* cited by examiner

SIGNAL MESSAGE COMPRESSION

FIELD OF THE INVENTION

The present invention relates to communication systems, and in particular, to signal message compressors within communication sessions handling SIP messages.

DESCRIPTION OF THE RELATED ART

A communication system can be seen as a facility that enables communication sessions between two or more entities such as user equipment and/or other nodes associated with the communication system. The communication may comprise, for example, communication of voice, data, multimedia and so on. A user equipment may, for example, be provided with a two-way telephone call or multi-way conference call. A user equipment may also be provided with a connection to an application providing entity, for example to an application server (AS), thus enabling use of services provided by the application server.

A communication system typically operates in accordance with a given standard or specification which sets out what the various entities associated with the communication system are permitted to do and how that should be achieved. For example, the standard or specification may define if the user, or more precisely, user equipment is provided with a circuit switched service and/or a packet switched service. Communication protocols and/or parameters which shall be used for the connection may also be defined. In other words, a specific set of "rules" on which the communication can be based on needs to be defined to enable communication by means of the system.

Communication systems providing wireless communication for user equipment are known. An example of the wireless systems is the public land mobile network (PLMN). Another example is a mobile communication system that is based, at least partially, on the use of communication satellites. Wireless communications may also be provided by means of other arrangements, such as by means of wireless local area networks (WLAN). Communication on the wireless interface between the user equipment and the elements of the communication network can be based on an appropriate communication protocol. The operation of the station apparatus of the communication system and other apparatus required for the communication can be controlled by one or several control entities. The various control entities may be interconnected. One or more gateway nodes may also be provided for connecting a communication network to other networks. For example, a mobile network may be connected to communication networks such as an IP (Internet Protocol) and/or other packet switched data networks.

An example of the services that may be offered for users of a communication system is the so called multimedia services. An example of the communication systems enabled to offer multimedia services is the Internet Protocol (IP) Multimedia network. IP Multimedia (IM) functionalities can be provided by means of a IP Multimedia Core Network (CN) subsystem, or briefly IP Multimedia subsystem (IMS). The IMS includes various network entities for the provision of the multimedia services.

The Third Generation Partnership Project (3GPP) has defined use of the General Packet Radio Service (GPRS) as a backbone communication system for the provision of the IMS services, the GPRS being given herein as a non-limiting example of a possible backbone communication system enabling the multimedia services. The Third Generation Partnership Project (3GPP) has also defined a reference architecture for the third generation (3G) core network which will provide the users of user equipment with access to the multimedia services. This core network is divided into three principal domains. These are the Circuit Switched (CS) domain, the Packet Switched (PS) domain and the Internet Protocol Multimedia (IM) domain.

The latter of these, the IM domain, is for ensuring that multimedia services are adequately managed. The 3G IM domain supports the Session Initiation Protocol (SIP) as developed by the Internet Engineering Task Force (IETF). Session Initiation Protocol (SIP) is an application-layer control protocol for creating, modifying and terminating sessions with one or more participants (endpoints).

Before a user equipment is able to communicate with an IM CN subsystem, a GPRS attach procedure must be performed and a communication channel known as Packet Data Protocol (PDP) context for SIP signalling must be established.

With low-rate IP connectivity, transmission delays are significant. Call setup and feature invocation are adversely affected by account retransmissions and multiple messaging, as required in some flows. SigComp protocols provide a solution to this problem by offering robust, loss-less compression of application messages. Due to the heavy signaling involved and SIP, being a text based protocol, 3GPP IMS Release 5 standards mandates SigComp (Signaling Compression).

Once a device is in receipt of a SigComp compressed message or a message to compress a uncompressed message using the SigComp protocols, the device provides a virtual machine (UDVM) with limited resources for compressing/decompressing the message.

The virtual machine is quite limited in its capabilities. For example the memory usable by the virtual machine is limited to the receive buffer used by the decompressing/compressing endpoint. The total amount of memory allocated for receive buffer and virtual machine is typically only a few kilobytes. This is because for SIP endpoints the default decompression memory size (dms) is 8 kilobytes, therefore in the virtual machine for compression and decompression both instructions and data must fit within this limited space. The virtual machine program is allowed simple I/O operations: it can input data from the compressed message, it can output decompressed data, and it can create, access and free state items. State items are items stored within the virtual machine memory from previously received messages.

The memory used by a UDVM is typically 4 kilobytes or less. Part of it is consumed by bytecode, i.e and its variables. Typically, there is only 3.5 kilobytes or less available for the ring buffer and other data structures storing the received compressed message, the processed decompressed message and any further dictionaries. When compressing longer messages, it is not possible to keep known static (3468 or 4836 bytes depending on algorithm) and dynamic dictionaries as well as complete compressed message completely in the memory.

The UDVM is active only when the protocol message is received. After receiving a SigComp message, the endpoint invokes the UDVM. For example in decompression the UDVM executes the bytecode or instructions to perform the decompression steps until the message has been completely decompressed or an error occurs. The UDVM can save data between UDVM instances in form of the state items. The state items can be used to make the compression more efficient; they can be used to store the compression algorithms or compression context within a compressed session. A SigComp session endpoint is called compartment. The amount of data that a decompressor can store within each compartment is also severely limited, for SIP endpoints the default value of state memory size (sms) is 2048 bytes.

Typically the UDVM when initiated loads into the ring buffer part of the available memory data from compartments such as the SIP dictionary, values which represent commonly used terms in decompressed SIP messages.

The problem with limited memory can severely restrict the efficiency of the compression algorithm. As the SIP dictionary states must fit totally into the state memory available within the compartment there is not usually available space for more than a couple of dictionaries. If for example the state memory size is 2048 bytes, which contains the bytecode (400 bytes), an initial loaded dictionary (usually the recovered first message, typically the initial REGISTER request or response for SIP) takes (700 bytes), then the compressor has only the memory space to load one session-specific dictionary of 900 bytes (for example an initial INVITE or '180' response dictionary).

The limited state memory size also prevents the SigComp compressor from updating the dynamic dictionary state when working with unreliable channels (e.g. for UDP connections). This is because when the compressor tries to update the state any loss of acknowledgement between endpoints can lead to loss of dictionary synchronization.

Using the above typical figures, when the compressor sends two messages each of which aimed to update a dynamic state (700 bytes each), the combined size of the updated and old states exceed the available state memory (400+700+700+700>2048), and therefore the compressor is unable to determine which dynamic dictionary states is stored in the decompressor.

The present methods employed using unreliable links allows the compressor to update the dynamic dictionary only when the compressor is certain that there is available space in the state memory for both old and new dictionary. Thus if the update fails or the compressor receives no acknowledgement, the compressor explicitly frees the memory space of the failed update dictionary or uses both the known and updated dictionary.

Thus the combination of the limited state and compression/decompression memory sizes together with the typical dictionary size lead to the problems of limited dictionary capacity and limited update capability. Furthermore these limitations can also lead to the overwriting of the ring buffer stored dictionaries as the buffer pointer wraps round after appending to the ring buffer the processed message decompressed data. All three of these problems lead to reduced efficiency compression/decompression algorithms—which as the stored decompression message is typically used in future compression/decompression instances produces larger dictionary sizes and further reduced efficiency.

SUMMARY OF THE INVENTION

Embodiments of the present invention aim to at least partially address the above problem.

There is provided according to the present invention a method for compressing a signalling message in a communication system, the method comprising the steps of: receiving a part of the signalling message; detecting in a memory a copy of the part of the signalling message; comparing the length of the detected part against a stored length value; and dependent on the output of the comparison step performing a step of storing the detected part of the signalling message in the memory.

The step of storing may be performed only after the comparing step determines the stored length value is greater than the length of the detected part.

The memory may comprise a first memory part and a second memory part, the method may further comprise the step of determining which part of the memory the copy of the part of the signalling message is detected.

The stored length value may be dependent on the step of determining which part of the memory the copy of the part of the signalling message is detected.

The first memory part may comprise a dictionary.

The dictionary may comprise at least one of: a dynamic dictionary and a static dictionary.

The stored length value may be 4 bytes when the part of the signalling message is detected in the first memory part.

The stored length value may be 7 bytes when the part of the signalling message is detected in the second memory part.

The memory may comprise a ring buffer.

According to a second aspect of the present invention there is provided a communications device for compressing a signalling message in a communication system, comprising: a memory; a data detector arranged to detect in the memory a copy of a part of the signalling message and arranged to output the length of any detected part; a length comparator arranged to compare the length of the detected part against a length value; and a memory controller arranged to receive the output from the length comparator, the memory controller arranged to store the detected part of the signalling message to the memory on the basis of the received length comparator output.

The memory may comprise a first memory part and a second memory part.

The communications device may further comprise a position reader arranged to detect the position of the copy of the detected part in the memory, and wherein the position reader may be arranged to output a length value to the length comparator dependent on the detected position.

The position reader may be arranged to output a first length value when the reader detects the copy is in a first part and a second length value when the reader detects the copy is in a second part.

The first memory part may comprise a dictionary.

The dictionary may comprises at least one of: a dynamic dictionary and a static dictionary.

The memory may be a ring buffer.

The ring buffer may be a ring buffer in a virtual machine.

The virtual machine may be a universal compressor virtual machine.

According to a third aspect of the present invention there is provided a computer program product arranged to implement a method for compressing a signalling message in a communication system, the method comprising the steps of: receiving a part of the signalling message; detecting in a memory a copy of the part of the signalling message; comparing the length of the detected part against a stored length value; and dependent on the output of the comparison step performing a step of storing the detected part of the signalling message in the memory.

BRIEF DESCRIPTION OF THE DRAWINGS

For better understanding of the present invention, reference will now be made by way of example to the accompanying drawings in which.

DETAILED DESCRIPTION OF THE PREFERRED EMBODIMENTS

Certain embodiments of the present invention will be described in the following by way of example, with reference to the exemplifying architecture of a third generation (3G) mobile communications system. However, it shall be appreciated that the embodiments may be applied to any suitable communication system.

Figure 1:
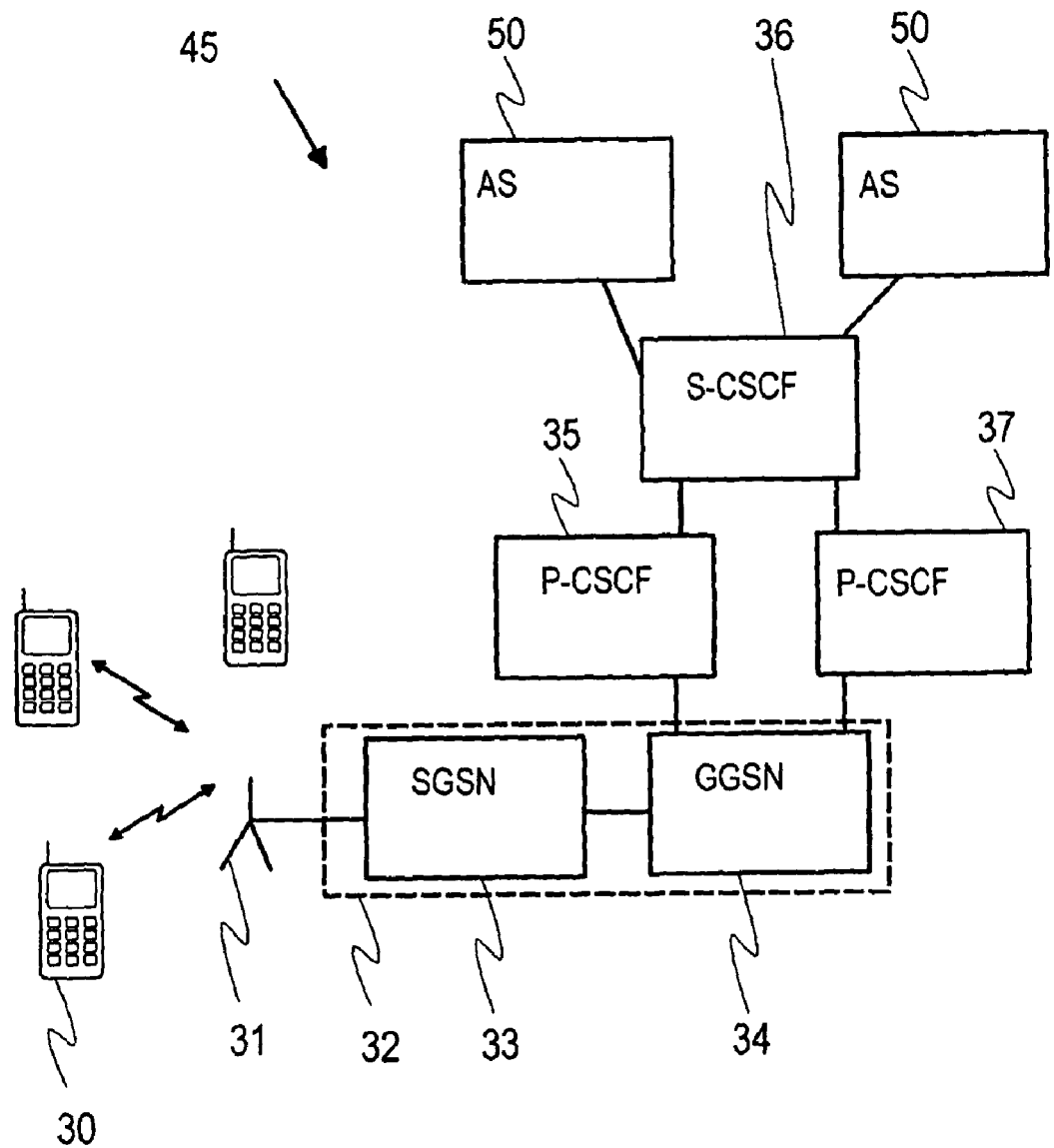
FIG. 1 shows a schematic view of a communication system environment wherein the invention can be embodied.

Reference is made to FIG. 1 which shows an example of a network architecture wherein the invention may be embodied. In FIG. 1 an IP Multimedia Network 45 is provided for offering IP multimedia services for IP Multimedia Network subscribers.

As described above, access to IP Multimedia (IM) services can be provided by means of a mobile communication system. A mobile communication system is typically arranged to serve a plurality of mobile user equipment usually via a wireless interface between the user equipment and at least one base station 31 of the communication system. The mobile communication system may logically be divided between a radio access network (RAN) and a core network (CN).

The base station 31 is arranged to transmit signals to and receive signals from a mobile user equipment 30 via a wireless interface between the user equipment and the radio access network. Correspondingly, the mobile user equipment 30 is able to transmit signals to and receive signals from the radio access network via the wireless interface.

In the shown arrangement the user equipment 30 may access the IMS network 45 via the access network associated with the base station 31. It shall be appreciated that, although, for clarity reasons FIG. 1 shows a base station of only one radio access network, a typical communication network system usually includes a number of radio access networks.

The 3G radio access network (RAN) is typically controlled by appropriate radio network controller (RNC). This controller is not shown in order to enhance clarity. A controller may be assigned for each base station or a controller can control a plurality of base stations, for example in the radio access network level. It shall be appreciated that the name, location and number of the radio network controllers depends on the system.

The mobile user equipment 30 of FIG. 1 may comprise any appropriate mobile user equipment adapted for Internet Protocol (IP) communication to connect the network. For example, the mobile user may access the cellular network by means of a Personal computer (PC), Personal Data Assistant (PDA), mobile station (MS) and so on. The following examples are described with reference to mobile stations.

One skilled in the art is familiar with the features and operation of a typical mobile station. Thus, it is sufficient to note that the user may use a mobile station for tasks such as for making and receiving phone calls, for receiving and sending data from and to the network and for experiencing multimedia content or otherwise using multimedia services. A mobile station may include an antenna for wirelessly receiving and transmitting signals from and to base stations of the mobile communication network. A mobile station may also be provided with a display for displaying images and other graphical information for the user of the mobile user equipment. Camera means may be provided for capturing still or video images. Speaker means are also typically provided. The operation of a mobile station may be controlled by means of an appropriate user interface such as control buttons, voice commands and so on. Furthermore, a mobile station is provided with a processor entity and a memory means.

It shall be appreciated that although only few mobile stations are shown in FIG. 1 for clarity, a great number of mobile stations may be in simultaneous communication with a communication system.

A core network (CN) typically includes various switching and other control entities and gateways for enabling the communication via a number of radio access networks and also for interfacing a single communication system with one or more communication system such as with other cellular systems and/or fixed line communication systems. In the 3GPP systems the radio access network is typically connected to an appropriate core network entity or entities such as, but not limited to, a serving general packet radio service support node (SGSN) 33. The radio access network is in communication with the serving GPRS support node via an appropriate interface, for example on an Iu interface. The serving GPRS support node, in turn, typically communicates with an appropriate gateway, for example a gateway GPRS support node 34 via the GPRS backbone network 32. This interface is commonly a switched packet data interface.

In a 3GPP network, a packet data session is established to carry traffic flows over the network. Such a packet data session is often referred as a packet data protocol (PDP) context. A PDP context may include a radio bearer provided between the user equipment and the radio network controller, a radio access bearer provided between the user equipment, the radio network controller and the SGSN 33, and switched packet data channels provided between the serving GPRS service node 33 and the gateway GPRS service node 34. Each PDP context usually provides a communication pathway between a particular user equipment and the gateway GPRS support node and, once established, can typically carry multiple flows. Each flow normally represents, for example, a particular service and/or a media component of a particular service. The PDP context therefore often represents a logical communication pathway for one or more flow across the network. To implement the PDP context between user equipment and the serving GPRS support node, at least one radio access bearer (RAB) needs to be established which commonly allows for data transfer for the user equipment. The implementation of these logical and physical channels is known to those skilled in the art and is therefore not discussed further herein.

FIG. 1 shows also a plurality of application servers 50 connected to the exemplifying Internet Protocol (IP) Multimedia network 45. The user equipment 30 may connect, via the GPRS network 32 and an IMS network 45, to at least one of the application servers 50. It shall be appreciated that a great number of application servers may be connected to a data network.

Communication with the application servers is controlled by means of functions of the data network that are provided by appropriate controller entities. For example, in the current third generation (3G) wireless multimedia network architectures it is assumed that several different servers providing various control functions are used for the control. These include functions such as the call session or call state control functions (CSCFs). The call session functions may be divided into various categories. FIG. 1 shows proxy call session control functions (P-CSCF) 35 and 37 and a serving call session control function (S-CSCF) 36. It shall be appreciated that similar functions may be referred to in different systems with different names.

A user who wishes to use services provided by an application server via the IMS system may need first to register with a serving controller, such as the serving call session control function (S-CSCF) 36. The registration is required to enable the user equipment to request for a service from the multimedia system. As shown in FIG. 1, communication between the S-CSCF 36 and the user equipment 30 may be routed via at least one proxy call session control function (P-CSCF) 35. The proxy CSCF 35 thus acts as a proxy which forwards messages from the GGSN 34 to a serving call session control function 36 and vice versa.

The REGISTER message used by the user above is one example of a SIP (session initiation protocol) message. Other request SIP messages include, INVITE which indicates a user or service is being invited to participate in a call session, ACK which confirms that the client has received a final response to an INVITE request, BYE which terminates a call and can be sent by either the caller or the callee, CANCEL which cancels any pending searches but does not terminate a call that has already been accepted, and OPTIONS which queries the capabilities of servers.

As has been described earlier it is known to compress these SIP messages using the protocol set known as SigComp. This protocol set is defined in RFC (request for comments) 3320 "Signaling Compression (SigComp)". Furthermore in order to perform both compression and decompression within a device a UDVM (universal decompression virtual machine) is initiated for each message to be compressed or decompressed.

The UDVM initiated for a compression procedure is also known as a compressor. A UDVM initiated for a decompression procedure is also known as a decompressor. The UDVM on initiation is defined within a memory space specified by the SigComp protocols. The memory space used in a compression procedure is known as the compression memory, and similarly the memory space used in a decompression procedure is known as a decompression space.

Figure 2:
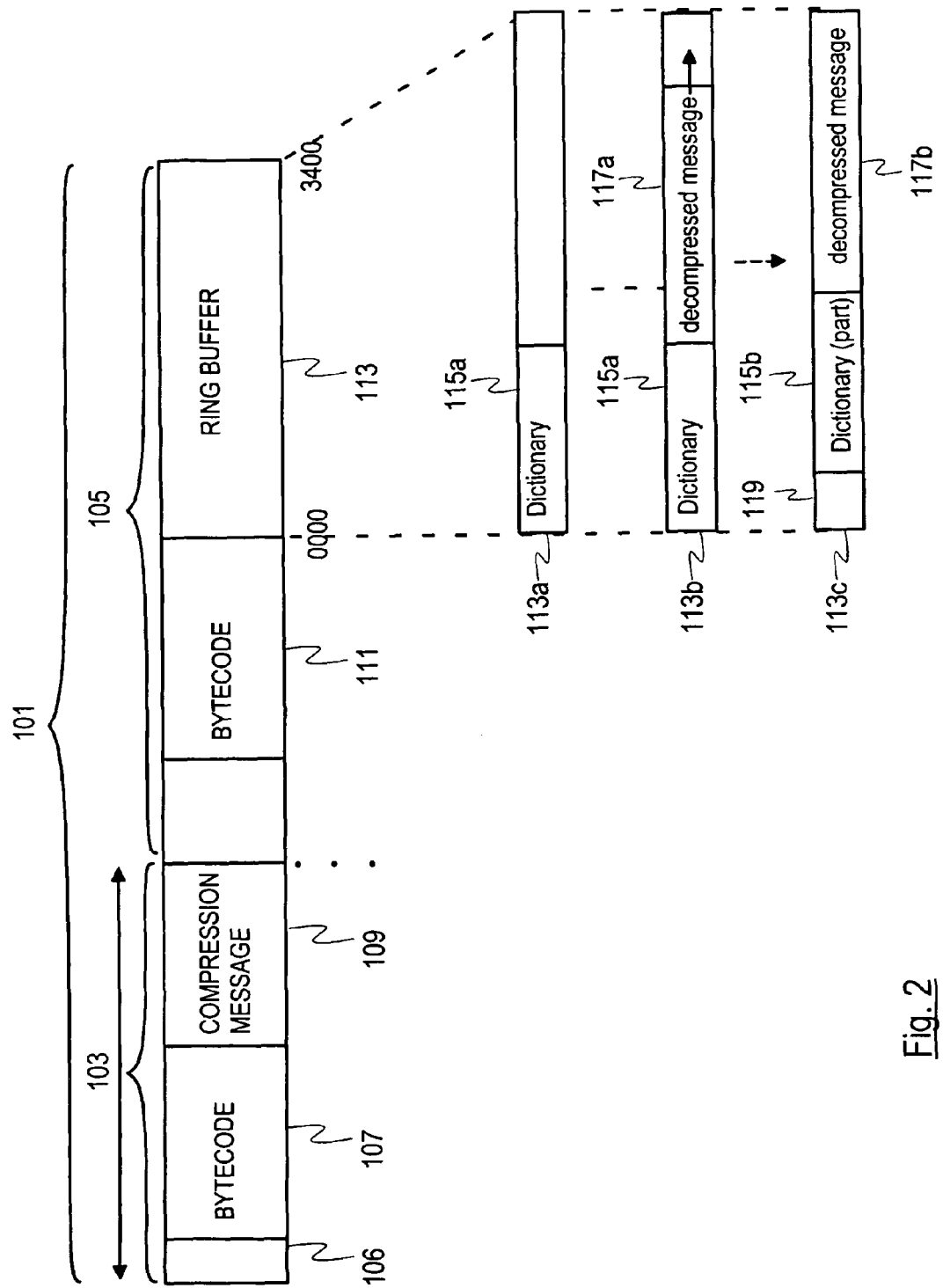
FIG. 2 is a schematic view of a typical decompression UDVM memory system showing the operation of a typical dictionary within the memory block.

Referring now to FIG. 2 a typical compression memory 101 is shown as used to compress a message/data stream. The compression memory 101 used by the compressor comprises a SigComp portion 103 and a UDVM portion 105. The SigComp portion 103 itself comprises a SigComp header portion 106 for storing any SigComp message header items, a Bytecode portion 107 for storing any received compression algorithm instructions, and a message portion 109 buffering at least part of the received message or data stream. In some examples the Bytecode portion is not used as the instruction set used by the UDVM is loaded from a previously stored instruction set.

The UDVM portion 105 comprises a bytecode portion 111 for storing the instructions for carrying out the compression and a ring buffer 113. The ring buffer 113 is used by the user terminal UDVM as the compression 'history window' storing data which can be referenced by the compressor in order to reconstruct the original message. A ring buffer as known in the art is a statically or dynamically allocated block of memory whereby the final memory location is linked to the first memory location in the block. Thus once the end location of the memory block is reached the operation is pointed back to the start location of the memory block to produce a discontinuous memory block. This process is also known as wrapping round the ring buffer 113.

The typical compression algorithms used by the UDVM for SigComp protocol messages and data streams are the various known LZ77 compression algorithm variants. The LZ77 compression algorithm works by storing a history window of the most recently read data and comparing the current data being encoded with the data in the history window. The output compressed stream/message contains references to the position in the history window, and the length of the match. If a match cannot be found within the history window the character itself is simply encoded into the stream and flagged as a 'literal'. The compressed stream/message therefore comprises two types of symbols, literals and length/position pairs. The most popular variants of the algorithm family are the LZW, LZSS and DEFLATE algorithms. The differences between these lies in the algorithm used to search current data from the history window, the LZSS algorithm uses a simple binary tree search whereas the DEFLATE algorithm uses a hash table search.

The ring buffer stores copies of the previously received symbols of message/data stream and which the compression algorithm uses as the history window to search for copies of the currently read symbols.

A simplified example of the DEFLATE compression algorithm, as defined in RFC 1951, is shown here for reference:

```
def DEFLATE(compressed_stream, ring, message):
    start = 0
    while start < len(message):
        s = message[start:]
        position, length = ring.search(s)
        s = s[:length]
        if length > 1:
            compressed_stream.append((length, position))
        else:
            compressed_stream.append(s)
        ring.append(s) # Insert match or literal into ring
        start += length
```

The algorithm shown above searches uncompressed parts of the message against data stored in the history window (ring buffer). The search returns the length and the position of the longest match. If no match is found, length is 1, and the first byte of the search contents is inserted into compressed stream as a literal, else the length and position of the match is inserted into compressed stream. Then the compressed part of the message is appended to the ring buffer.

The typical algorithm used involves further steps such as that of backtracking the output stream if a longer match is found.

In order to improve the efficiency of the compression ration of the LZ77 algorithms it is common to preload previous messages or external dictionaries to provide sufficient data to search prior to the addition of symbols from the present message. This process is sometimes known as populating the window history.

This is shown by the first exploded ring buffer memory block 113a as shown in FIG. 2. The first exploded ring buffer memory block 113a comprises a dictionary part 115.

The SigComp compressors typically attempt to use more than one dictionary to increase the efficiency of the compression.

Furthermore when the compressor is compressing a particularly long message or data stream the appending of the currently read message symbol to the ring buffer causes the read message to reach the end of the ring buffer and to overwrite the dictionary stored. This degradation of the dictionary can often lead to a lowering of the efficiency of the compression algorithm.

The decompressor uses an identical set of dictionaries and has an identical ring buffer size in order to decompress the compressed message. In the decompressor the dictionaries are loaded into the ring buffer prior to the start of any decompression of the message. The compressed message is then examined for any reference to the ring buffer and the decompressed message read from the ring buffer or determined to be a 'literal' symbol. The read or determined value is then copied to the ring buffer and also output as part of the decompressed or original message.

Once the decompressor/compressor has finished the final uncompressed output is stored as a 'state'. These states or compartments can be used as dictionary data for future compression and decompression. However as these states are themselves decompressed they usually contain redundant information.

Figure 3:
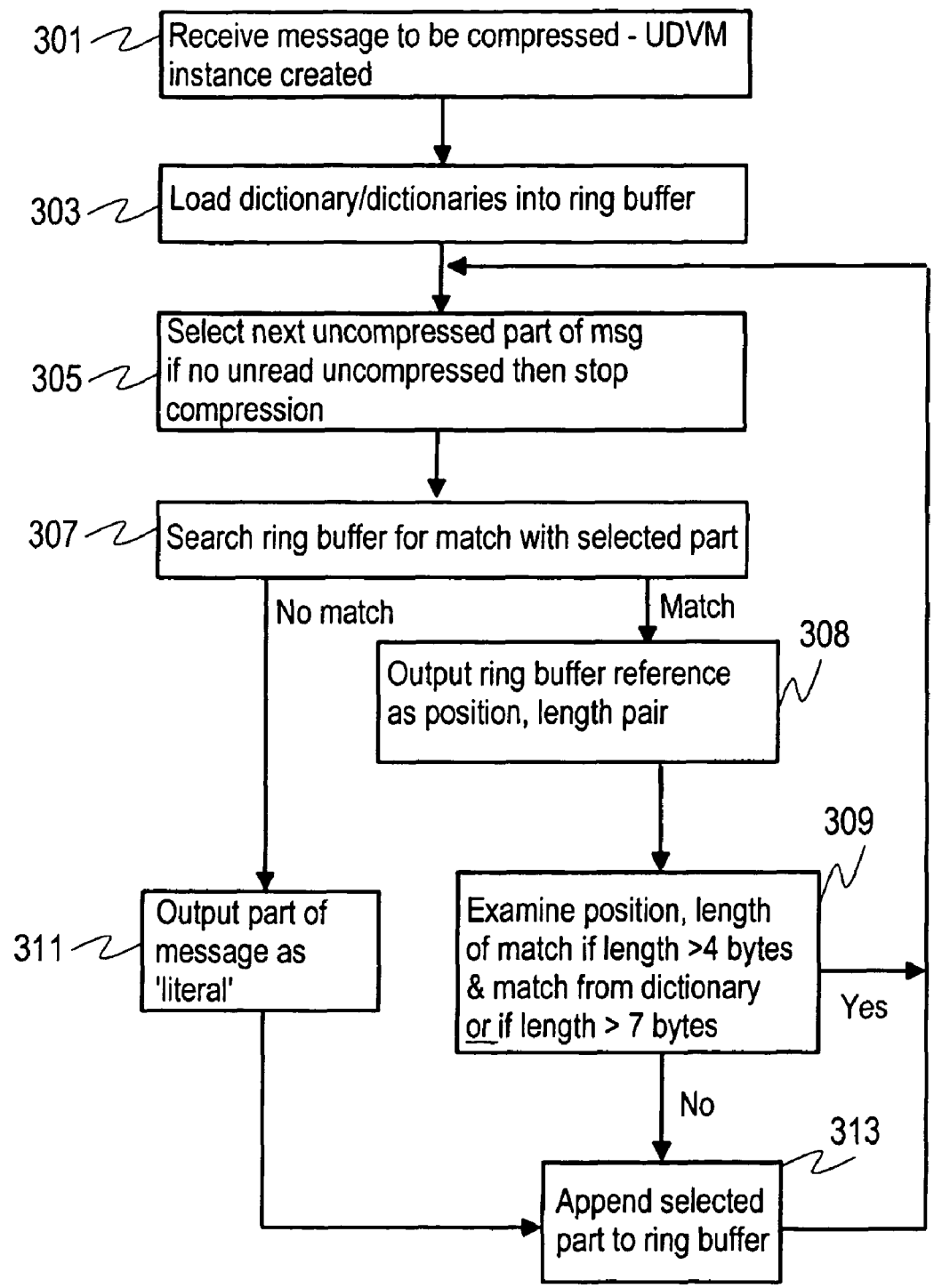
FIG. 3 shows a flow diagram for the operation of the UDVM during a compression operation in accordance with an embodiment of the present invention.

With reference to FIG. 3 a flow diagram of an improved compressor incorporating an embodiment of the present invention is shown.

The first step 301 the message or at least a first part of the data stream to be compressed is received. This step is effectively the initiation of the UDVM compression instance.

The next step 303 the compressor loads the ring buffer with copies of static and/or dynamic dictionaries.

The following step 305 selects the next uncompressed part of the message, If there are no further uncompressed parts then the operation stops.

The following step 307 searches the ring buffer for a copy of the selected uncompressed part.

If a match is detected the next step 308 outputs a reference to the ring buffer in terms of a position, length pair. This output is used to form a part of the compressed data message.

Furthermore if a match is detected the compressor, in step 309, examines the position, length pair to determine where the reference points to a dictionary memory location in the ring buffer if the dictionary memory location reference length is above a threshold value of 4 bytes, or where the reference points to a non dictionary memory location in the ring buffer whether the ring buffer reference length is above a threshold value of 7 bytes. The compressor can determine whether the match has occurred within the dictionary memory locations or within the remainder of the ring buffer by comparing the determined match position against a stored position indicator containing the value of the ring buffer input pointer when the first uncompressed part is selected. In other words the relative position of the dictionary entry to the start of the compression memory location is larger than the accumulated ring size.

If either of the threshold values are exceeded then the method passes back to the selection step 305. If neither of the threshold values are exceeded then the method proceeds to step 313. In step 313 the compressor appends the selected part to the ring buffer. The method then returns to step 305 where the next uncompressed part is selected.

If no match of the selected part is found in the ring buffer then the method carries out step 311, and the selected part is output as a 'literal'. The method then proceeds to step 311 where the selected 'literal' part is appended to the ring buffer.

A further example of the method of compression is described with reference to the pseudocode below. In this example the minlate function code (a minimum state length deflation program) searches the history_window portion for selected parts of the message and outputs the compressed-_stream. Furthermore is where there is a match then the position and length are examined to determine whether they are above the length threshold for dictionary and non dictionary locations to determine if the history_window (ring buffer) should be appended.

```
def MINLATE(compressed_stream, history_window, message):
    start = minlated_ring_length = 0
    while start < len(message):
        position, length = history_window.search(message, start)
        if length > 1:
            compressed_stream.append((length, position))
        else:
            compressed_stream.append(message[start : start + 1])
        if position > minlated_ring_length and length > 4:
            'Do not append dictionary entries longer than 4 bytes'
        elif length > 7:
            'Do not append matches longer than 7 bytes'
        else:
            minlated_ring_length += length
            history_window.append(message[start : start + length])
        start += length
```

In order that the compression and decompression algorithms are synchronized, i.e. at any point of compression of a symbol or decompression back to the same symbol the memory searched by the compressor and accessed by the decompressor must be the same, the improved decompression algorithm follows a similar algorithm.

Figure 4:
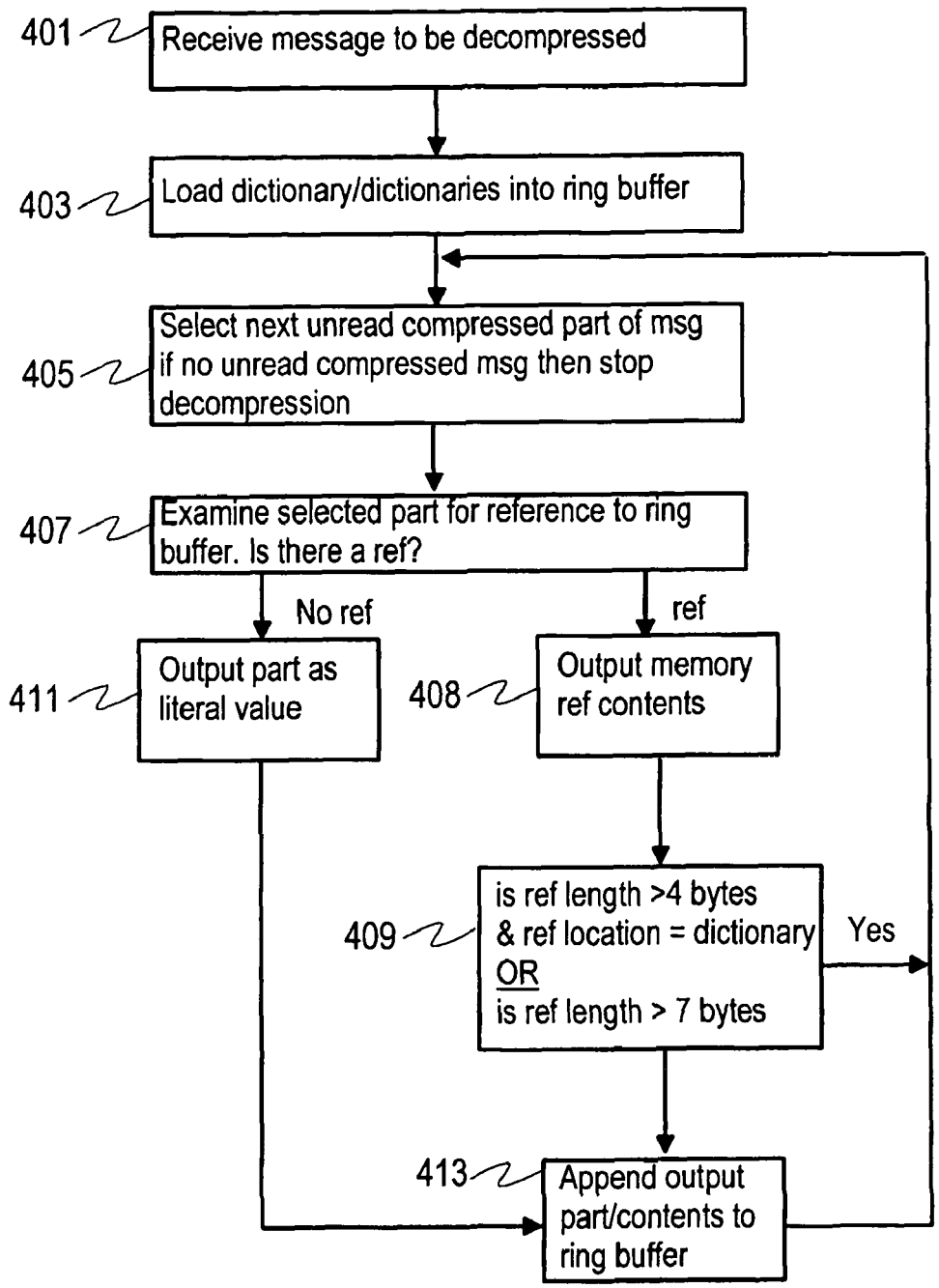
FIG. 4 shows a flow diagram for the operation of the UDVM during a decompression operation in accordance with an embodiment of the present invention.

With reference to FIG. 4 a flow diagram for the operation of the UDVM during an improved decompression operation is shown.

The first step 401 the message or at least a first part of the data stream to be decompressed is received. This step is effectively the initiation of the UDVM compression instance.

The next step 403 the decompressor loads the ring buffer with copies of static and/or dynamic dictionaries.

The following step 405 selects the next unread compressed part of the message. If there are no further unread compressed parts then the operation stops.

The following step 407 searches the selected part for a reference to the ring buffer.

If a reference is detected the next step 408 outputs the memory reference contents according to the position, length pair format of the reference. This output is used to form a part of the decompressed data message.

Furthermore if a reference is detected the decompressor, in step 409, examines the position, length pair reference value to determine, where the reference points to a dictionary memory location in the ring buffer if the dictionary memory location reference length is above a threshold value of 4 bytes, or where the reference points to a non dictionary memory location in the ring buffer whether the ring buffer reference length is above a threshold value of 7 bytes. The decompressor can determine whether the reference position is within the dictionary memory locations or within the remainder of the ring buffer by comparing the determined reference position against a stored position indicator containing the value of the ring buffer input pointer when the first compressed part is selected. In other words the relative position of the dictionary entry to the start of the decompression memory location is larger than the accumulated ring size.

If either of the threshold values are exceeded then the method passes back to the selection step 405. If neither of the threshold values are exceeded then the method proceeds to step 413. In step 413 the decompressor appends the selected part to the ring buffer. The method then returns to step 405 where the next unread compressed part is selected.

If no memory reference is found in the ring buffer then the method carries out step 411, and the selected part is output as a 'literal'. The method then proceeds to step 411 where the selected 'literal' part is appended to the ring buffer.

In all of the above examples the final compartment of the state is smaller than the typical compression algorithm final compartment, and the level of redundant and repeated elements within both the compression and decompression state compartments are significantly reduced. In reducing the length of the compartment, the problems associated with severe memory space limitations are significantly lessened. Not only can more of these 'minilated' compartments be fitted into a compression and/or decompression memory space and therefore increase the number of available dictionaries to be searched, but the update problem is also mitigated as it much more likely that there would be sufficient memory space for multiple revisions of the dictionary.

To provide an example of the efficiency of embodiments of the present invention a typical SIP register message to be compressed is shown below.

This message is 619 bytes long. Using the prior art deflate compression algorithm the compartment state produced is 683 bytes long. However where the above algorithm is used together with a standard SIP static dictionary (as defined in RFC 3485) the state is reduced to only 182 bytes.

--- sip:ims4.so.noklab.net<sip:10.21.38.206;lr>10.21.129.134:5060
t0-xADPZwgXmJsip:iop3@WkuxADI5AA3600sec-agree673
TVqxAIybZ0R0D8pVTbzeqPu5gR0yIz "iop3.te@", "", "",
"", uri="", MD5700

---

REGISTER sip:ims4.so.noklab.net SIP/2.0
Security-Client: Digest
Route: <sip:10.21.38.206;lr>
Via: SIP/2.0/UDP 10.21.129.134:5060;branch=z9hG4bKt0-xADPZwgXmJ
From: sip:iop3@ims4.so.noklab.net;tag=WkuxADI5AA
To: sip:iop3@ims4.so.noklab.net
Contact: sip:iop3@10.21.129.134;expires=3600
Supported: sec-agree
Require: sec-agree
Proxy-Require: sec-agree
CSeq: 673487 REGISTER
Call-ID: TVqxAIybZ0R0D8pVTbzeqPu5gR0yIz
Authorization: digest username="iop3.private@ims4.so.noklab.net", nonce="", realm="ims4.so.noklab.net", response="", uri="ims4.so.noklab.net", algorithm=MD5
Max-Forwards: 70
Content-Length: 0

---

Furthermore if now a further message was compressed and decompressed, for example a SIP INVITE message, such as the following:

---

INVITE sip:iop2@ims4.so.noklab.net SIP/2.0
Route: <sip:10.21.38.206;lr>,<sip:%01ADPM@oscscf.ims4.so.noklab.net:49997;lr>
Via: SIP/2.0/UDP 10.21.129.134:5060;branch=z9hG4bKXq-xAGuu3k4b8
Security-Verify: digest;d-ver="84487381404e4e1f6695dacde2e212c6"
From: sip:iop3@ims4.so.noklab.net;tag=OumxAEHfhA
To: sip:iop2@ims4.so.noklab.net
Contact: sip:iop3@10.21.129.134
Supported: 100rel,sec-agree
Require: sec-agree
Proxy-Require: sec-agree
CSeq: 673488 INVITE
Call-ID: RgqxAxfEu49x5d-akiRGsKUvLCiKw0
Max-Forwards: 70
Content-Type: Application/Sdp
Content-Length: 213
v=0
o=-- 2435697 2096738854 IN IP4 172.21.137.53
s=--
c=IN IP4 172.21.137.53
t=0 0
m=video 49152 RTP/AVP 96
a=sendonly
a=rtpmap:96 H263-2000/90000
m=audio 57344 RTP/AVP 97
a=sendonly
a=rtpmap:97 AMR/8000 the typical deflate compression and decompression algorithms generate a state with a length of 792 bytes. However by using the improved compression and decompression algorithms as described earlier, together with the previous REGISTER state message the INVITE state length is only 238 bytes long.

```
2@,%01ADPM@oscscf.:49997;lr>Xq-xAGuu3k4b8
;d-ver="84487381404e4e1f6695dacde2e212c6"OumxAEHfhA2@,673488
RgqxAxfEu49x5d-akiRGsKUvLCiKw070ASdp213
- 2435697 2096738854 17237.53
s=-17237.53
49152 9696 H263-2000/9000057344 9797 AMR/8000
```

The above embodiments show the selective storing of the state values dependent on a simple determination of the match length and position. In other embodiments of the present invention further limitation of repetition of entries could be prevented by reducing the length threshold. Also it would be possible to use length of consecutive non matches to further modify the ring buffer contents to produce a smaller state output.

In other embodiments of the present invention the compressor itself can input marker bits or symbols into the compressed message/data flow to control the ring buffer usage at the decompressor. Thus in some embodiments of the present invention the compressor attaches a signaling bit to each match or literal, which when read by the decompressor instructs the decompressor to append the decompressed value to the ring buffer.

The examples of the invention have been described in the context of an IMS system and GPRS networks. However, this invention is also applicable to any other standards. Furthermore, the given examples are described in the context of the so called all SIP networks with all SIP entities and communication channels known as PDP contexts. This invention is also applicable to any other appropriate communication systems, either wireless or fixed line systems, communication standards and communication protocols.

Examples of other possible communication systems enabling wireless data communication services, without limiting to these, include third generation mobile communication system such as the Universal Mobile Telecommunication System (UMTS), i-phone or CDMA2000 and the Terrestrial Trunked Radio (TETRA) system, the Enhanced Data rate for GSM Evolution (EDGE) mobile data network. Examples of fixed line systems include the diverse broadband techniques providing Internet access for users in different locations, such as at home and offices. Regardless the standards and protocols used for the communication network, the invention can be applied in all communication networks wherein registration in a network entity is required.

The embodiment of the invention have been discussed in the context of proxy and servicing call state control functions. Embodiments of the invention can be applicable to other network elements where applicable.

Furthermore it is noted that embodiments of the present invention can be controlled by hardware, software or any combination of hardware and software.

It is also noted herein that while the above describes exemplifying embodiments of the invention, there are several variations and modifications which may be made to the disclosed solution without departing from the scope of the invention as defined in the appended claims.

The invention claimed is:

1. A method comprising:
    detecting in a memory a copy of a part of a message to be compressed;
    comparing, by a processor, a length of the detected part against a stored length value; and
    in an instance in which it is determined that the stored length value is greater than the length of the detected part, causing the detected part of the message to be stored in a ring buffer.

2. A method as claimed in claim 1, wherein the message comprises a signaling message.

3. A method as claimed in claim 1, wherein the memory comprises a first memory part and a second memory part, the method further comprising:
    determining in which of the first memory part or the second memory part of the memory the copy of the part of the message is detected.

4. A method as claimed in claim 3, wherein the stored length value comprises a first length value in an instance in which the copy of the part of the message is detected in the first memory part, and wherein the stored length value comprises a second length value in an instance in which the copy of the part of the message is detected in the second memory part.

5. A method as claimed in claim 3, wherein the first memory part comprises a dictionary.

6. A method as claimed in claim 5, wherein the dictionary comprises at least one of:
    a dynamic dictionary, or
    a static dictionary.

7. A method as claimed in claim 3, wherein the stored length value is 4 bytes in an instance in which the part of the message is detected in the first memory part.

8. A method as claimed in claim 3, wherein the stored length value is 7 bytes in an instance in which the part of the message is detected in the second memory part.

9. A method as claimed in claim 1, further comprising outputting a reference to the ring buffer as a position, length pair, the reference to be used to form a part of a compressed representation of the message.

10. An apparatus comprising at least one processor and at least one memory storing computer program code, wherein the at least one memory and stored computer program code are configured, with the at least one processor, to cause the apparatus to at least:
    detect a stored copy of a part of a message to be compressed;
    compare a length of the detected part against a length value; and
    in an instance in which it is determined that the length value is greater than the length of the detected part, cause the detected part of the message to be stored in a ring buffer.

11. An apparatus as claimed in claim 10, wherein the copy of the part of the message is stored in one of a first memory part or a second memory part.

12. An apparatus as claimed in claim 10, wherein the at least one memory and stored computer program code are configured, with the at least one processor, to further cause the apparatus to:
    detect a storage position of the detected part; and
    determine the length value dependent on the detected storage position.

13. An apparatus as claimed in claim 11, wherein the at least one memory and stored computer program code are configured, with the at least one processor, to further cause the apparatus to:

determine in which of the first memory part or the second memory part the detected part of the message is detected; and wherein the length value comprises a first length value in an instance in which the detected part is detected in the first memory part and, wherein the length value comprises a second length value in an instance in which the detected part is detected in the second memory part.

14. An apparatus as claimed in claim 11, wherein the first memory part comprises a dictionary.

15. An apparatus as claimed in claim 14, wherein the dictionary comprises at least one of:

a dynamic dictionary, or a static dictionary.

16. A computer program product as claimed in claim 10, the method further comprising outputting a reference to the ring buffer as a position, length pair, the reference to be used to form a part of a compressed representation of the message.

17. An apparatus as claimed in claim 10 wherein the ring buffer is in a virtual machine.

18. An apparatus as claimed in claim 17, wherein the virtual machine is a universal compressor virtual machine.

19. An apparatus as claimed in claim 10, wherein the message comprises a signaling message.

20. An apparatus as claimed in claim 10, wherein the at least one memory and stored computer program code are configured, with the at least one processor, to further cause the apparatus to output a reference to the ring buffer as a position, length pair, the reference to be used to form a part of a compressed representation of the message.

21. A computer program product comprising at least one non-transitory memory, the at least one non-transitory memory storing a computer program configured to implement a method comprising:

detecting in a memory a copy of a part of a message to be compressed;

comparing a length of the detected part against a stored length value; and, in an instance in which it is determined that the stored length value is greater than the length of the detected part, causing the detected part to be stored in a ring buffer.

* * * * *